US008227870B2

(12) United States Patent
Chudzik et al.

(10) Patent No.: US 8,227,870 B2
(45) Date of Patent: Jul. 24, 2012

(54) METHOD AND STRUCTURE FOR GATE HEIGHT SCALING WITH HIGH-K/METAL GATE TECHNOLOGY

(75) Inventors: Michael P. Chudzik, Danbury, CT (US); Ricardo A. Donaton, Cortlandt Manor, NY (US); William K. Henson, Beacon, NY (US); Yue Liang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/364,564

(22) Filed: Feb. 2, 2012

(65) Prior Publication Data
US 2012/0126335 A1  May 24, 2012

Related U.S. Application Data

(62) Division of application No. 12/715,781, filed on Mar. 2, 2010, now Pat. No. 8,138,037.

(60) Provisional application No. 61/160,867, filed on Mar. 17, 2009.

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl. ... 257/369; 257/380; 257/529; 257/E27.06; 257/E23.149

(58) Field of Classification Search .................. 257/209, 257/369, 380, 529, 530, E23.147, E23.149, 257/E27.06, E27.062
See application file for complete search history.

(56) References Cited

U.S. PATENT DOCUMENTS

| | | | |
|---|---|---|---|
| 6,333,223 B1 | 12/2001 | Moriwaki et al. | |
| 7,534,671 B2 | 5/2009 | Chuang et al. | |
| 2008/0038879 A1 | 2/2008 | Kurjanowicz | |
| 2009/0236669 A1* | 9/2009 | Chen et al. | 257/380 |
| 2009/0283840 A1 | 11/2009 | Coolbaugh et al. | |
| 2010/0019344 A1 | 1/2010 | Chuang et al. | |
| 2010/0052058 A1 | 3/2010 | Hsu et al. | |
| 2010/0059823 A1 | 3/2010 | Chung et al. | |
| 2010/0087055 A1 | 4/2010 | Lai et al. | |

* cited by examiner

*Primary Examiner* — Hoai V Pham
(74) *Attorney, Agent, or Firm* — Joseph P. Abate; Roberts Mlotkowski Safran & Cole, P.C.

(57) ABSTRACT

A method and structure to scale metal gate height in high-k/metal gate transistors. A method includes forming a dummy gate and at least one polysilicon feature, all of which are formed from a same polysilicon layer and wherein the dummy gate is formed over a gate metal layer associated with a transistor. The method also includes selectively removing the dummy gate while protecting the at least one polysilicon feature. The method further includes forming a gate contact on the gate metal layer to thereby form a metal gate having a height that is less than half a height of the at least one polysilicon feature.

10 Claims, 8 Drawing Sheets

METHOD AND STRUCTURE FOR GATE HEIGHT SCALING WITH HIGH-K/METAL GATE TECHNOLOGY

CROSS REFERENCE TO RELATED APPLICATIONS

This application is a divisional application of U.S. patent application Ser. No. 12/715,781, which was filed on Mar. 2, 2010, which claims priority under 35 U.S.C. §119(e) to U.S. Provisional Application No. 61/160,867, filed Mar. 17, 2009, the contents of all of which are expressly incorporated by reference in their entirety.

FIELD OF THE INVENTION

The invention generally relates to the fabrication of semiconductor circuit chips and, more particularly, to a structure and method to scale the gate height of a gate electrode.

BACKGROUND

Semiconductor device manufacturers are migrating toward the use of high dielectric constant (e.g., high-k) gate dielectric, instead of the commonly used gate oxide. Metal gates, instead of polysilicon gates, are typically used to obtain the maximum benefit of using a high-k gate dielectric since a metal gate permits a better performance since it eliminates the voltage drop at the gate dielectric interface. In addition, metal gates enable optimization of the work function between the gate, gate dielectric, and substrate. Many integration schemes use a damascene replacement gate process to form such metal gates.

For example, a damascene gate is commonly formed by first depositing a high-k gate dielectric on a substrate, depositing polysilicon on the gate dielectric, and patterning the polysilicon into a dummy gate (e.g., mandrel). Any desired spacers, implants (e.g., source, drain, halo, etc.), silicides, etc., are formed before an interlevel dielectric layer (ILD) is formed over the top of the structure. The ILD is then recessed down to the top of the polysilicon and the polysilicon dummy gate is stripped away, leaving a gate trench in the ILD. Metal is then deposited into the gate trench, resulting in a metal gate formed on a high-k gate dielectric.

Transistors having relatively tall metal gates may suffer from parasitic capacitance. However, it is not a trivial matter to simply reduce the height of the dummy polysilicon gate in order to achieve a shorter metal gate. This is because aggressively scaling (e.g., reducing) the polysilicon height may also affect other devices that are fabricated using the same polysilicon as the dummy gate. Particularly, reducing the polysilicon height can detrimentally affect polysilicon resistors and e-fuses.

Accordingly, there exists a need in the art to overcome the deficiencies and limitations described hereinabove.

SUMMARY

In a first aspect of the invention, there is a method of forming a semiconductor structure. The method includes forming a dummy gate and at least one polysilicon feature, all of which are formed from a same polysilicon layer and wherein the dummy gate is formed over a gate metal layer associated with a transistor. The method also includes selectively removing the dummy gate while protecting at least one polysilicon feature. The method further includes forming a gate contact on the gate metal layer to thereby form a metal gate having a height that is less than half a height of the at least one polysilicon feature.

In another aspect of the invention, there is a method for forming a semiconductor structure. The method includes: forming a high-k dielectric layer on a substrate; forming a metal layer on the high-k dielectric layer; and forming a silicon layer on the metal layer. The method also includes: forming an etch-stop layer on the silicon layer; forming a polysilicon layer on the etch-stop layer; and patterning the polysilicon layer into a dummy gate associated with a transistor and at least one polysilicon feature associated with at least one other device. The method further includes: forming a barrier layer over the substrate, the dummy gate, and the at least one polysilicon feature; removing a portion of the barrier layer from over the dummy gate while masking the barrier layer over the at least one polysilicon feature; selectively removing the dummy gate to expose a portion of the etch-stop layer; removing the exposed portion of the etch-stop layer to expose a portion of the silicon layer; and forming a silicide gate contact from the exposed silicon layer.

In another aspect of the invention, there is a structure comprising: a transistor comprising a metal gate on a high-k dielectric, the metal gate comprising a portion of a metal layer and a gate contact; and a device comprising a polysilicon feature formed over a second portion of the metal layer and over a second portion of the high-k dielectric. A height of the metal gate is less than half the height of the polysilicon feature.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to the fabrication of semiconductor circuit chips and, more particularly, to a structure and method to scale the gate height of a metal gate. In accordance with aspects of the invention, a damascene-like approach is used to reduce the height of a metal gate while a mask protects other devices to maintain the polysilicon height of the other devices. In embodiments, a single polysilicon layer is used to form a dummy gate for a transistor and also a polysilicon feature for at least one other device. The at least one other device is masked while the dummy gate is removed and a scaled metal gate is formed for the transistor. A particular exemplary implementation of the invention employs a silicon/oxide/silicon gate structure where the top silicon of the transistor gate electrode is removed selectively. This allows aggressive polysilicon height scaling that reduces overall system capacitance while maintaining a raised resistor and e-fuse structure. In this manner, a single polysilicon layer can be used to form relatively short metal gates for transistors and relatively tall polysilicon features for adjacent devices such as resistors and e-fuses.

Figure 1:
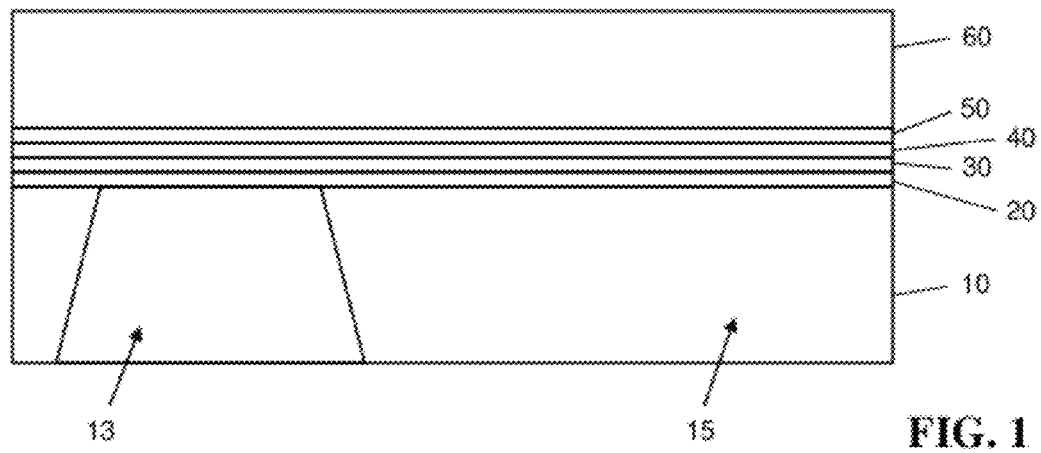
FIGS. 1-14 show views of structures and respective processing steps in accordance with aspects of the invention.

FIGS. 1-14 show views of structures and respective processing steps in accordance with aspects of the invention. Particularly, FIG. 1 shows a cross-section view of a semiconductor structure comprising a substrate 10 including an active region 13 and an isolation region 15. The substrate 10 may comprise any suitable semiconductor substrate including, but not limited to: Si, SiGe, SiC, SiGeC, and layered semiconductors such as silicon-on-insulator (SOI), Si/SiGe, and SiGe-on-insulator (SGOI).

As depicted in FIG. 1, a gate dielectric 20 is formed on portions of the substrate 10. In embodiments, the gate dielectric 20 comprises a high-k gate dielectric such as a layer of hafnium oxide formed on the substrate 10. The gate dielectric 20 layer may have a depth (e.g., thickness) of about 1 nm to about to 2 nm, while other thicknesses are also contemplated by the present invention. In embodiments, the gate dielectric 20 has a dielectric constant value of about 15.0 or greater, which is considered high-k. However, the invention is not limited to this particular arrangement of gate dielectric and any suitable material or layers of materials may be used as the gate dielectric 20 in accordance with aspects of the invention. For example, the gate dielectric 20 may be composed of hafnium silicate or other hafnium-based or zirconium-based high-k materials. Moreover, the gate dielectric 20 may be formed using conventional deposition process such as, for example, chemical vapor deposition (CVD) or plasma-assisted CVD, or a thermal growing process such as oxidation, nitridation or oxynitridation.

In embodiments, a metal layer 30 is formed on the gate dielectric 20. The metal layer 30 (e.g., gate metal layer) may be composed of any suitable gate electrode material such as, for example, titanium nitride (TiN), titanium tantalum nitride (TiTaN), other metals containing at least one of titanium, tantalum, and tungsten, or any other suitable conductive material. The metal layer 30 may have a depth of about 3 nm to about 8 nm, or any other desired depth (e.g., thickness), and may be formed using conventional techniques, e.g., chemical vapor deposition (CVD).

Still referring to FIG. 1, in accordance with aspects of the invention a silicon layer 40 is formed on the metal layer 30. In embodiments, the silicon layer 40 has a thickness of about 5 nm to about 20 nm; however, the invention is not limited to these thicknesses and any suitable thickness may be used within the scope of the invention. In embodiments, the silicon layer 40 is formed by a physical vapor deposition (PVD) process, but may also be formed by other processes, such as chemical vapor deposition (CVD).

FIG. 1 also shows an etch-stop layer 50 formed on the silicon layer 40. In embodiments, the etch-stop layer 50 may be composed of materials including, but not limited to, silicon dioxide, silicon oxynitride, and other oxides. The etch-stop layer 50 may also be composed of a high-k dielectric, such as those described with respect to gate dielectric 20. In embodiments, the etch-stop layer has a thickness of about 2 nm to about 5 nm; however, the invention is not limited to these thicknesses and any suitable thickness may be used within the scope of the invention. Moreover, the etch-stop layer 50 may be formed using conventional deposition process such as, for example, chemical vapor deposition (CVD) or plasma-assisted CVD, or a thermal growing process such as oxidation, nitridation or oxynitridation.

As additionally shown in FIG. 1, a polysilicon layer 60 is formed on the etch-stop layer 50. In accordance with aspects of the invention, the polysilicon layer 60 has a thickness of about 50 nm to about 80 nm; however, the invention is not limited to these thicknesses and any suitable thickness may be used within the scope of the invention. The polysilicon layer 60 may be formed using any suitable technique including, but not limited to, chemical vapor deposition (CVD).

Figure 2:
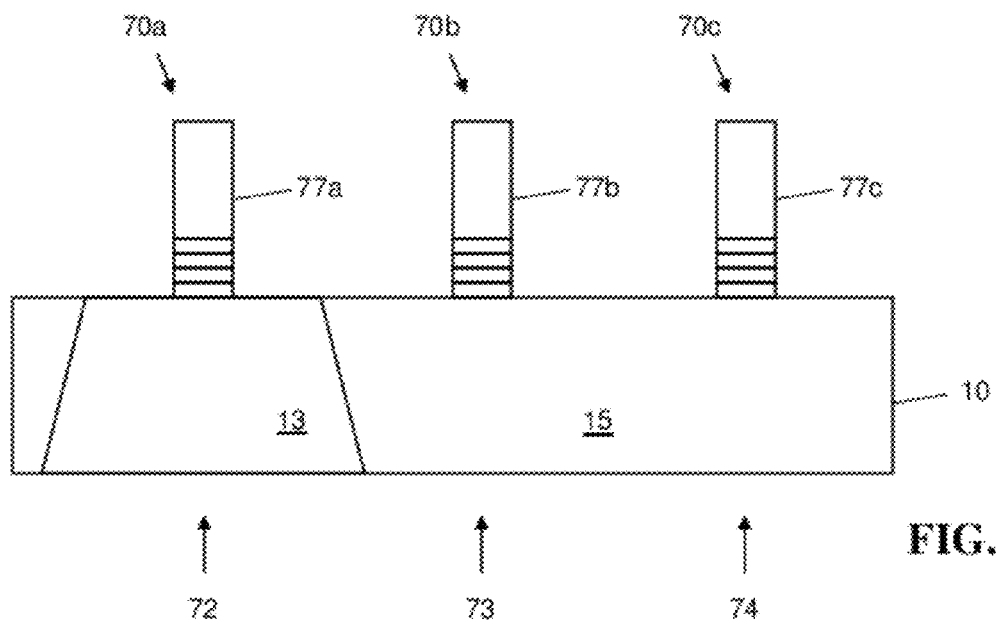

As depicted in FIG. 2, the layers 20, 30, 40, 50, and 60 are patterned into stacks 70a, 70b, 70c. The patterning may be performed using any conventional patterning process, such as, for example, photolithographic masking and reactive ion etch (RIE). Although three stacks 70a-c are shown, the invention is not limited to this number, and any desired number of stacks may be formed from the polysilicon layer 60. In embodiments, at least one stack (e.g., stack 70a) is formed over the active region 13 and at least one other stack (e.g., stacks 70b and 70c) is formed over the isolation region 15. Stacks formed over an active region correspond to a transistor and stacks over an isolation region correspond to a passive device, e.g., a resistor, e-fuse, etc. In the non-limiting exemplary embodiment described herein, stack 70a corresponds to a transistor 72 (e.g., FET), stack 70b corresponds to a resistor 73, and stack 70c corresponds to an e-fuse 74; however, the invention is not limited to this particular configuration and any desired configuration of stacks may be used. The stack 70a includes a dummy gate 77a of the transistor 72 formed from the polysilicon layer 60, and the stacks 70b and 70c comprise polysilicon features 77b and 77c formed from the same polysilicon layer 60.

Figure 3:
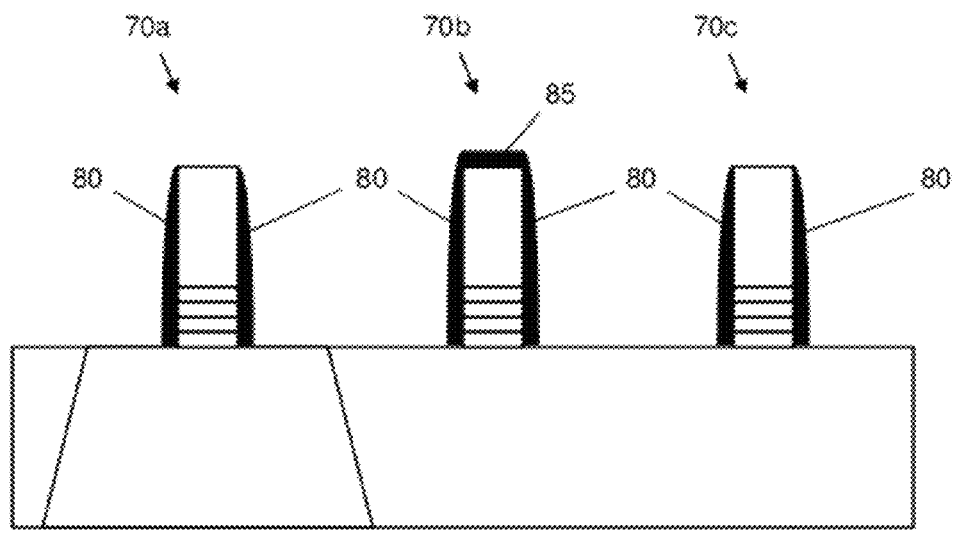

FIG. 3 shows the formation of sidewall spacers 80 adjacent the sides of the stacks 70a-c. The sidewall spacers 80 may be formed using conventional techniques, such as for example, blanket deposition of SiN via CVD, masking, and RIE. The sidewall spacers 80 may comprise any suitable materials, such as, for example, SiN, $SiO_2$, etc. Optionally, for a stack corresponding to a resistor (e.g., stack 70b) a cap 85 may be provided on the stack 70b. The cap 85 may be formed from the same material as the sidewall spacers 80 (e.g., SiN) and may be formed from the same initial blanket deposition of spacer material via appropriate masking. Also, although not shown, any suitable transistor features, such as implants (e.g., source, drain, halo, junction, etc.), embedded silicon germanium (eSiGe) source/drain, etc., may be formed with the structure of FIG. 3 using conventional semiconductor fabrication techniques.

Figure 4:
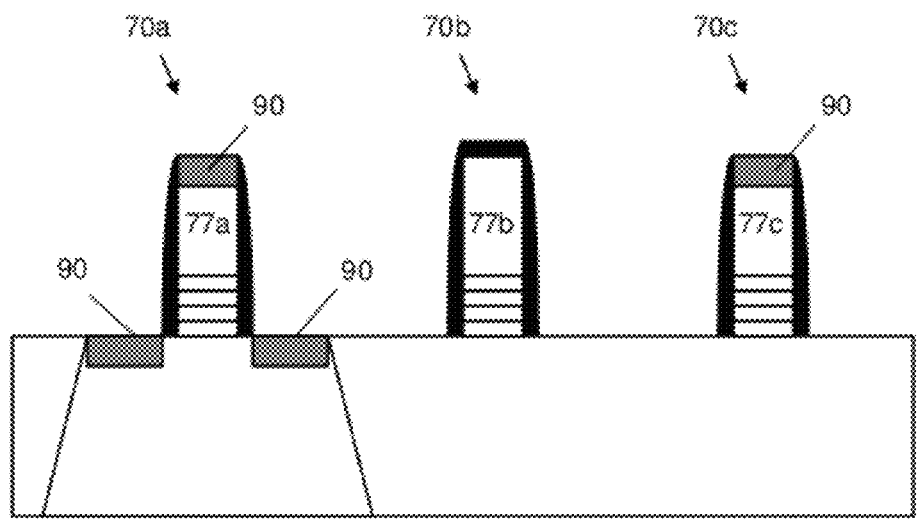

As depicted in FIG. 4, silicide regions 90 may be formed on exposed areas of silicon, including source/drain regions adjacent stack 70a, atop dummy gate 77a, and atop polysilicon feature 77c. The silicide regions 90 may be formed in any suitable manner. For example, the silicide regions 90 may be formed by selectively sputtering a nickel film onto the exposed silicon and annealing the film to form nickel silicide (NiSi). In embodiments, the silicide has a thickness of about 15 nm to 30 nm, although other thicknesses may be used within the scope of the invention. The invention is not limited to NiSi, and other silicides, such as cobalt silicide, may be used.

Figure 5:
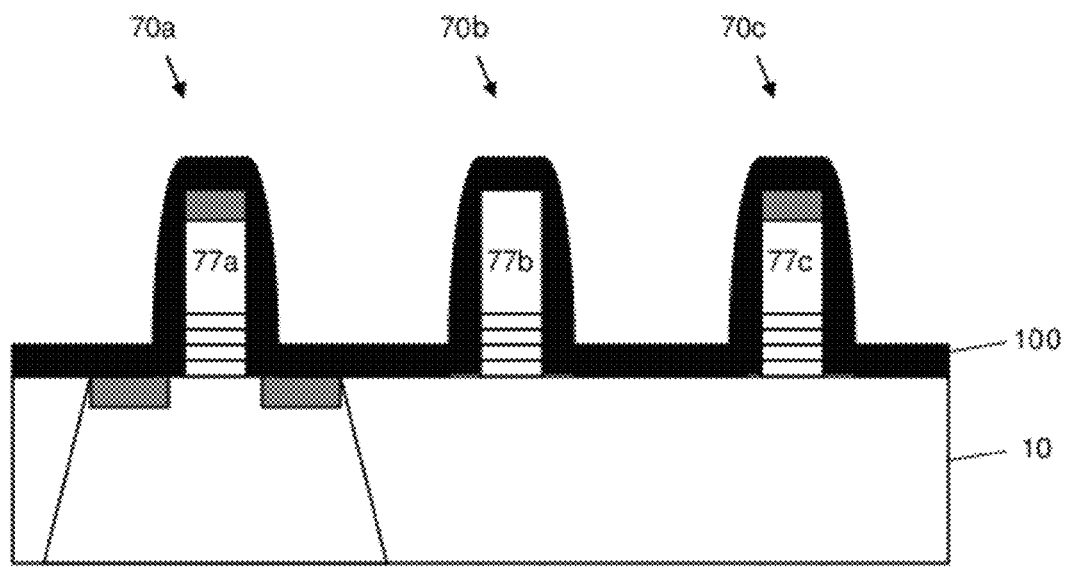

As shown in FIG. 5, a barrier layer 100 is conformally deposited over the entire structure including portions of the substrate 10. The barrier layer 100 may be composed of, for example, SiN and may be formed in any conventional manner, e.g., plasma enhanced chemical vapor deposition (PECVD), etc. Although a single unstressed barrier layer 100 is shown in FIG. 5, aspects the invention also contemplate the use of a dual stress liner for CMOS devices. More specifically, in accordance with aspects of the invention, the barrier layer 100 may comprise a first portion that is arranged in tensile stress formed over a NFET device and a second portion arranged in compressive stress formed over a PFET device. Dual stress liners and their fabrication are known such that further explanation is not believed necessary.

Figure 6:
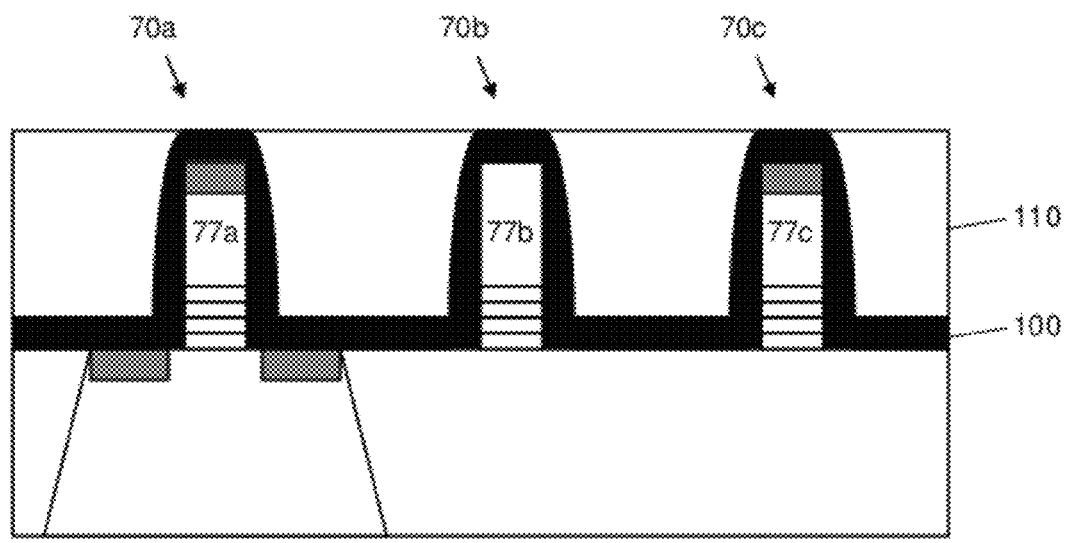

Additionally, as shown in FIG. 6, a dielectric layer 110 is deposited over the entire structure and the resulting structure is planarized. The dielectric layer 110 may be composed of any suitable material including but limited to SiO$_2$, tetraethylorthosilicate (TEOS), borophosphosilicate glass (BPSG), etc., and may be formed in any conventional manner, e.g., PECVD, etc. After forming the dielectric layer 110, the dielectric layer 110 is planarized down to the barrier layer 100 atop the stacks 70a-c. The planarization may be performed using any suitable technique, including but not limited to chemical mechanical polishing (CMP). The planarization may remove some, but not all, of the barrier layer 100 from atop the stacks 70a-c.

Figure 7:
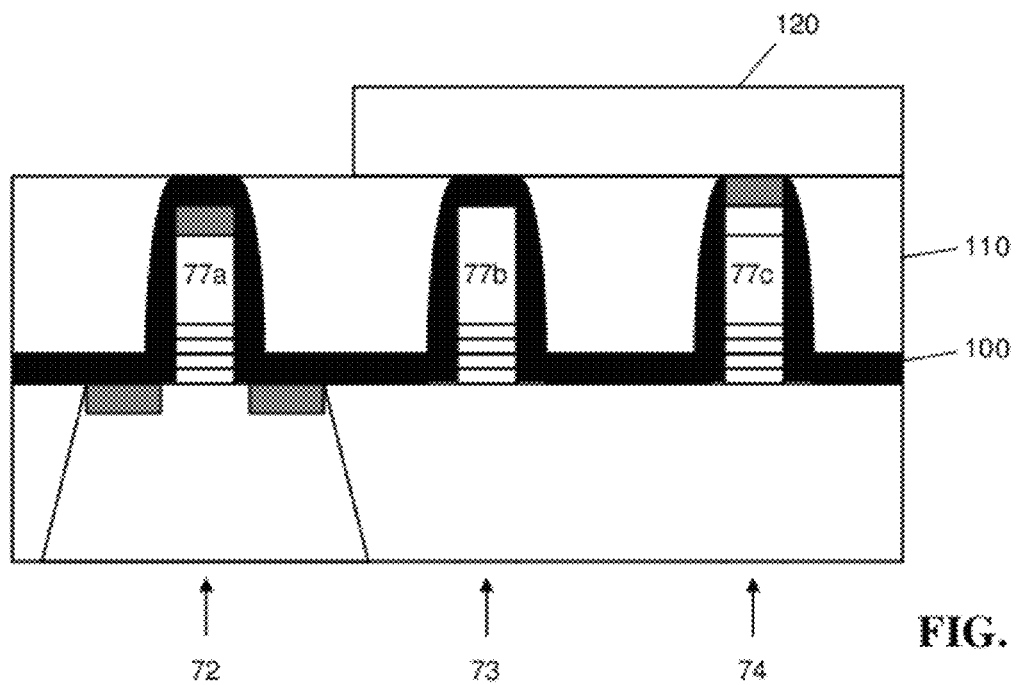

As shown in FIG. 7, a photoresist mask 120 is deposited and patterned (e.g., exposed and developed) on the upper surface of the structure. The photoresist mask 120 is deposited and patterned using conventional lithographic materials and etching processes. In embodiments, the pattern formed in the photoresist mask 120 covers the stacks that correspond to the resistor 73 and e-fuse 74 while leaving the stack corresponding to the transistor 72 unmasked.

Figure 8:
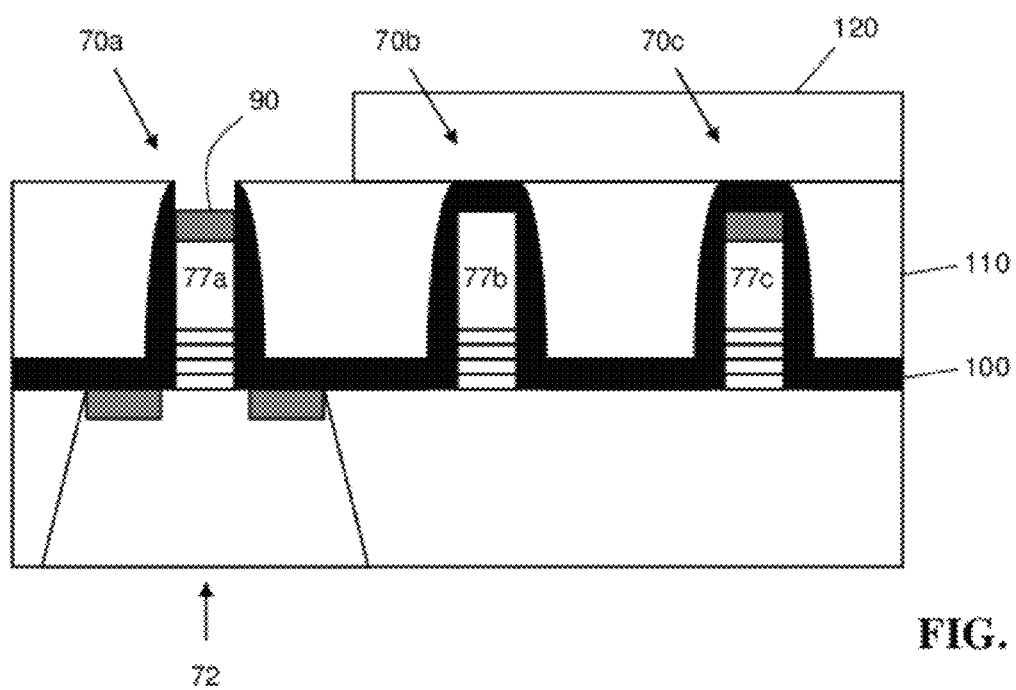

FIG. 8 shows the removal of a portion of the barrier layer 100 from over the stack 70a exposing the silicide region 90. In embodiments, the portion of the barrier layer 100 is removed using a dry RIE process; however, any suitable process can be used within the scope of the invention. The photoresist mask 120 protects the other devices (e.g., stacks 70b and 70c) while the portion of the barrier layer 100 is removed from over the transistor stack 70a. As such, the portion of the barrier layer 100 is removed from over the transistor stack 70a without removing any of the barrier layer 100 over the other devices (e.g., stacks 70b and 70c).

Figure 9:
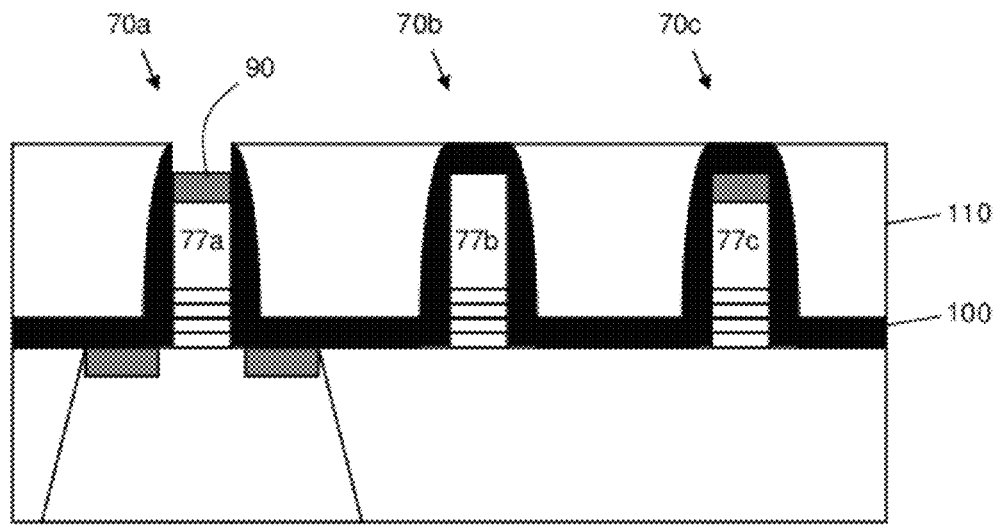
Figure 10:
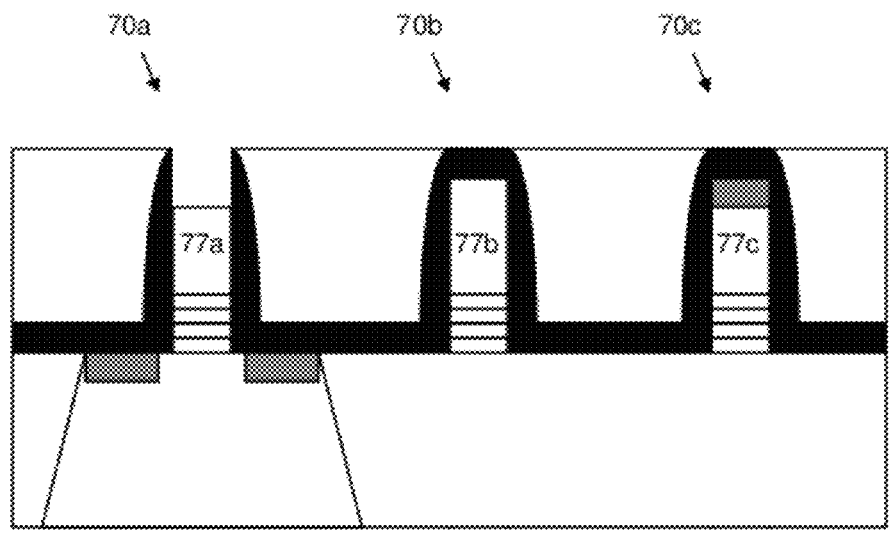

As depicted in FIG. 9, the photoresist mask 120 is stripped from atop the dielectric 110 and the barrier layer 100 using conventional mask stripping processes. As shown in FIG. 10, the silicide region 90 atop the dummy gate 77a is removed. In embodiments, the silicide region 90 is removed using a wet bath of hydrofluoric acid (HF); however, any suitable process may be used within the scope of the invention. Although FIGS. 9 and 10 depict stripping the photoresist mask 120 before removing the silicide region 90, it is understood that the order of these two steps can be reversed. In any event, after removal of the photoresist mask 120, the other devices (e.g., stacks 70b and 70c) are protected by the barrier layer 100 while the transistor 72 undergoes further processing as described herein.

Figure 11:
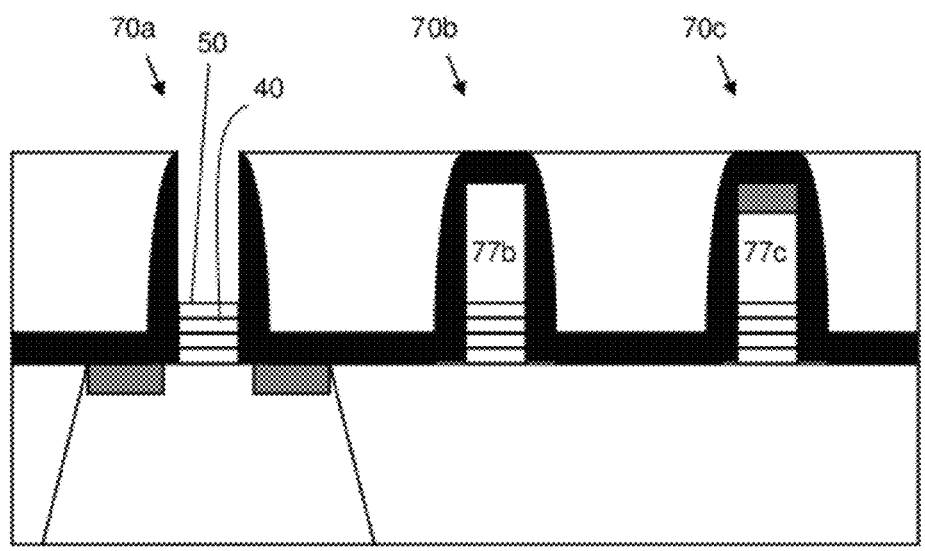

In accordance with aspects of the invention, the dummy gate 77a is removed, as shown in FIG. 11. The removal of the dummy gate 77a may be considered a selective removal since the other devices (e.g., stacks 70b and 70c) are protected (e.g., masked) by the barrier layer 100 during removal of the dummy gate 77a. In other words, the dummy gate 77a is removed without affecting the stacks 70b and 70c including the polysilicon features 77b and 77c. This preserves the height of the stacks 70b and 70c and polysilicon features 77b and 77c, while permitting the gate of the transistor to be further processed at a smaller scale, as described herein. In embodiments, the polysilicon of the dummy gate 77a is etched using a wet ammonium hydroxide (NH$_4$OH) etch process. The invention is not limited to this etch process, and other suitable processes may be used including, but not limited to, a chlorine-based or a bromine-based dry etch. The etch-stop layer 50 halts the etch during removal of the dummy gate 77a and protects the underlying silicon layer 40.

Figure 12:
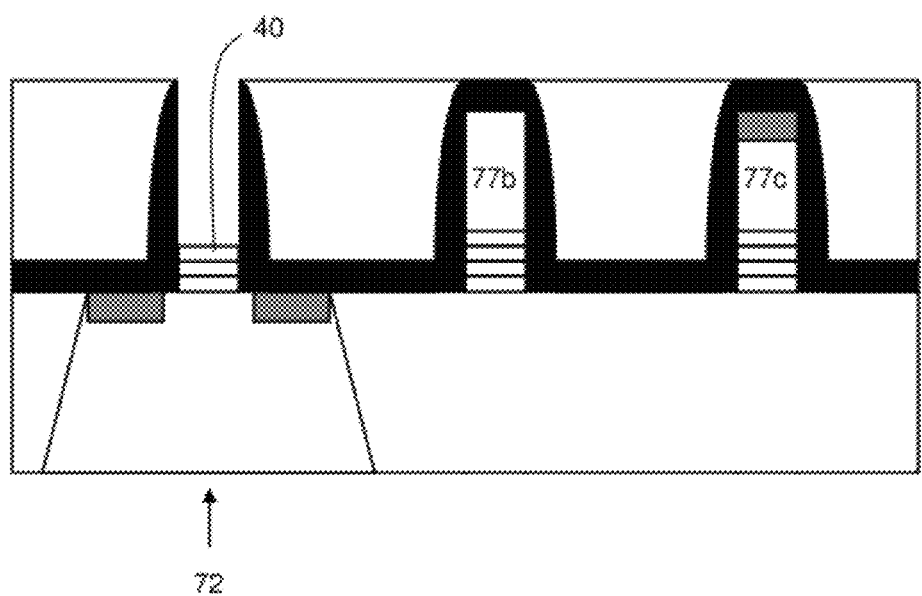

As depicted in FIG. 12, the etch-stop layer 50 is removed from the transistor. In embodiments, a wet HF process is used to remove the etch-stop layer 50; however, the invention is not limited to this process and ay suitable process may be used. Removal of the etch-stop layer 50 exposes the silicon layer 40 in the transistor 72.

Figure 13:
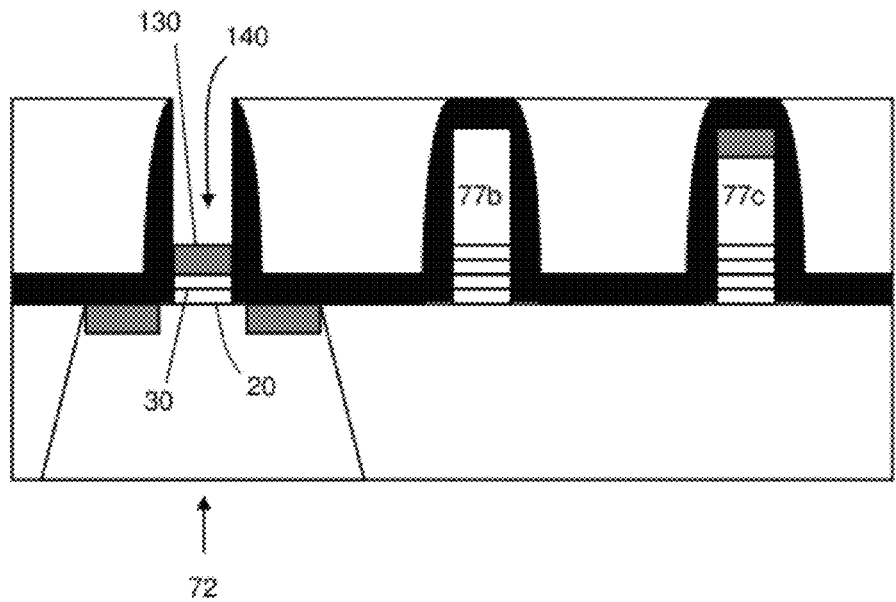
Figure 14:
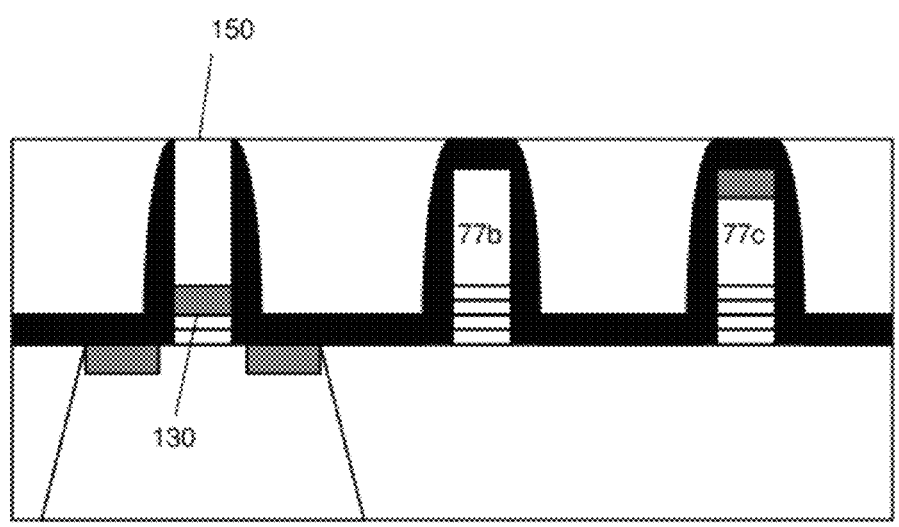

As shown in FIG. 13, a silicide gate contact 130 is formed at the transistor 72. In embodiments, the silicide gate contact 130 is formed by depositing a thin (e.g., about 2 nm to about 10 nm) film of nickel on the silicon layer 40 of the transistor and then thermally annealing the device to create NiSi atop the metal layer 30 of the transistor. Semiconductor fabrication techniques for forming silicide are known such that further explanation is not believed necessary. In this manner, a metal gate 140 for the transistor is formed on the high-k dielectric 20, the metal gate 140 having a height of about 10 nm to about 30 nm. In this manner, the metal gate 140 of the transistor may be formed at less than half the height of the polysilicon features 77b and 77c associated with the resistor and e-fuse, which reduces overall system capacitance without negatively affecting the performance of the resistor and/or e-fuse. As depicted in FIG. 14, a dielectric material 150 is formed in the gate trench, after which standard semiconductor processing steps may be used to form contacts to the operative portions of the transistor, resistor, and e-fuse.

In accordance with aspects of the invention described herein, a metal gate of a transistor is formed on a high-k dielectric using a damascene gate approach. In embodiments, the metal gate is formed using a dummy gate that is patterned from a same silicon layer as a polysilicon feature for another device, such as a resistor and/or an e-fuse. In implementations, a mask is used to protect the other device during removal of the dummy gate. In this manner, the gate height of the metal gate may be aggressively scaled to as low as about 10 nm to about 30 nm while the polysilicon feature height of the other device remains on the order of about 50 nm to about 80 nm, which advantageously reduces overall system capacitance without negatively affecting the performance of the resistor and/or e-fuse. Since the dummy gate is formed from the same polysilicon layer as the polysilicon feature of the other device, implementations of the invention avoid multiple polysilicon depositions that can lead to interference in the gate stack.

Figure 15:
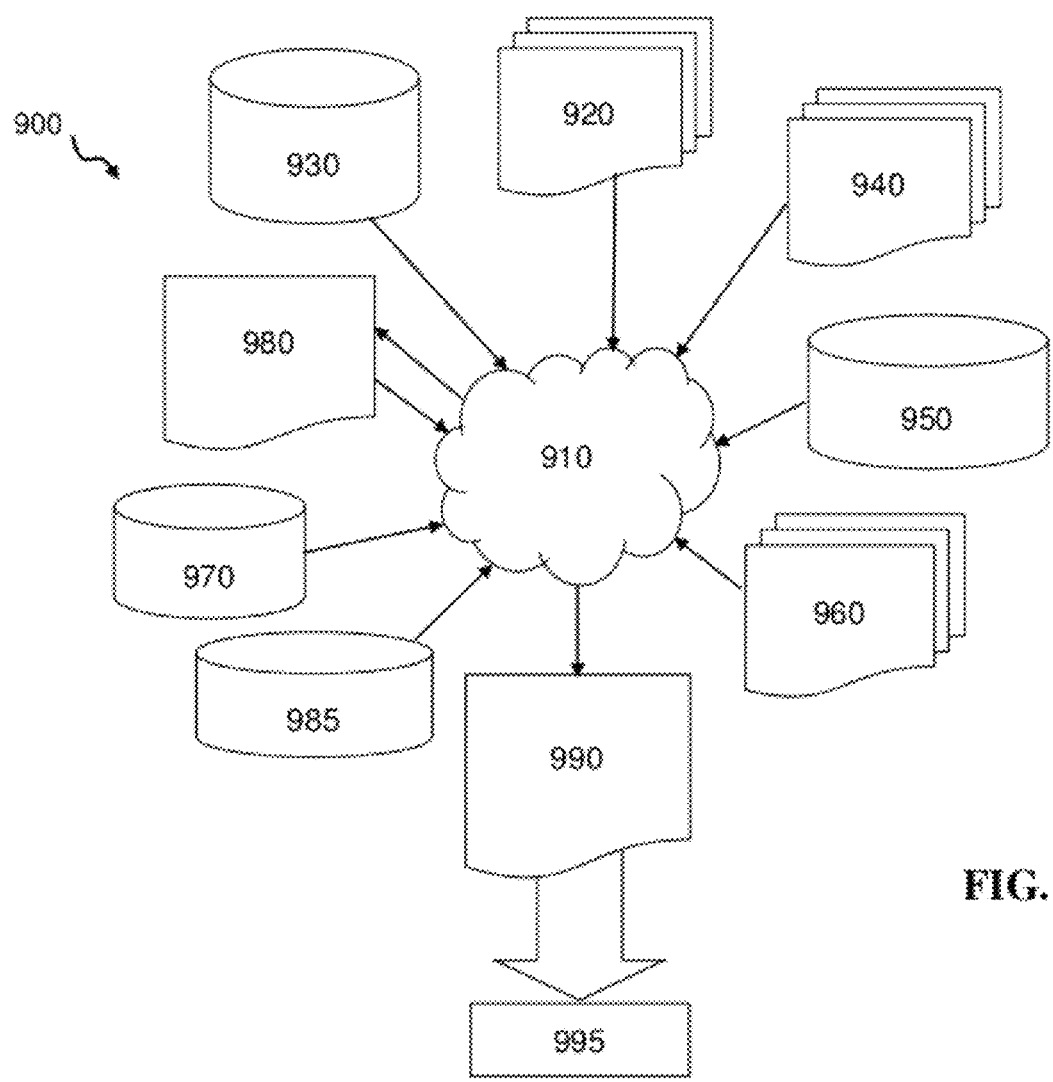
FIG. 15 is a flow diagram of a design process used in semiconductor design, manufacture, and/or test.

FIG. 15 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A semiconductor structure, comprising:
    a transistor comprising a metal gate on a high-k dielectric, the metal gate comprising a portion of a metal layer and a gate contact; and
    a device comprising a polysilicon feature formed over a second portion of the metal layer and over a second portion of the high-k dielectric;
    wherein a height of the metal gate is less than half the height of the polysilicon feature.

2. The semiconductor structure of claim 1, further comprising a second device comprising a second polysilicon feature formed over a third portion of the metal layer and over a third portion of the high-k dielectric.

3. The semiconductor structure of claim 2, wherein:
    the device comprises a resistor; and
    the second device comprises an e-fuse.

4. The semiconductor structure of claim 3, wherein the polysilicon feature and the second polysilicon feature are respective patterned portions of a same polysilicon layer.

5. The semiconductor structure of claim 1, further comprising a substrate including an active region and an isolation region.

6. The semiconductor structure of claim 5, wherein:
    the transistor is on the active region; and
    the device is on the isolation region.

7. The semiconductor structure of claim 1, further comprising an etch stop layer between the polysilicon feature of the device and the second portion of the metal layer.

8. The semiconductor structure of claim 7, further comprising a silicon layer between the polysilicon feature of the device and the second portion of the metal layer.

9. The semiconductor structure of claim 1, wherein the device comprises a passive device.

10. The semiconductor structure of claim 9, further comprising a silicide contact on the polysilicon feature of the device.

* * * * *